United States Patent [19]

Scifres et al.

[11] Patent Number: 4,803,691
[45] Date of Patent: Feb. 7, 1989

[54] LATERAL SUPERRADIANCE SUPPRESSING DIODE LASER BAR

[75] Inventors: Donald R. Scifres, San Jose; Hsing Kung, Sunnyvale; Peter Cross, Palo Alto, all of Calif.; Robert D. Burnham, Wheaton, Ill.; William Streifer, Palo Alto, Calif.

[73] Assignee: Spectra Diode Laboratories, Inc., San Jose, Calif.

[21] Appl. No.: 90,333

[22] Filed: Aug. 28, 1987

Related U.S. Application Data

[63] Continuation-in-part of Ser. No. 731,652, May 7, 1985, abandoned.

[51] Int. Cl.⁴ .............................................. H01S 3/19
[52] U.S. Cl. ..................................... 372/150; 372/45; 372/46; 372/48; 357/16; 357/17
[58] Field of Search ........................ 372/50, 97, 46, 45, 372/18, 48; 357/17, 16

[56] References Cited

U.S. PATENT DOCUMENTS

| | | | |
|---|---|---|---|
| 4,033,796 | 7/1977 | Burnham et al. | 148/175 |
| 4,255,717 | 3/1981 | Scifres et al. | 372/50 |
| 4,317,085 | 2/1982 | Burnham et al. | 372/50 |
| 4,594,718 | 6/1986 | Scifres et al. | 372/45 |
| 4,674,095 | 6/1987 | Heinen et al. | 372/45 |

OTHER PUBLICATIONS

Streifer et al., "Current Status of (GaAl) As Diode Lasers", SPIE vol. 269, Integrated Optics, pp. 1–7, 1981.
Botez et al., "High-Power Individually Addressable Monolithic Array of Constricted Double Hetero-Junction Large-Optical-Cavity Lasers", Applied Physics Letters, pp. 1040–1042, Dec. 1982.
Holyonyak et al., "Quantum-Well Heterostructure Lasers", IEEE Journal of Quantum Electronics, vol. QE-16, No. 2, pp. 170–186, Feb. 1980.
Dupuis, "Metalorganic Chemical Vapor Deposition in III-V Semiconductors", Science, vol. 226, pp. 623–629, Nov. 1984.
Scifres et al., "Lateral Grating Array High Power CW Visible Semiconductor Laser", Electronics Letters, vol. 18, No. 13, pp. 549–550, Jun. 14, 1982.

Primary Examiner—William L. Sikes
Assistant Examiner—Georgia Y. Epps
Attorney, Agent, or Firm—Thomas Schneck

[57] ABSTRACT

A diode laser bar producing a linear array of laser beams without lateral superradiance. The laser bar has a double-heterostructure or quantum well structure. Etched channels in the substrate create lateral corrugations in the subsequently deposited layers including the active region. The corrugations alternate between offset groove and plateau regions in the lateral direction but are straight in the longitudinal light propagating direction. Any laterally propagating light is interrupted at steps, between groove and plateau regions, by deflection, scattering or transmission out of the active region. Interruption may also be achieved with a plurality of parallel etched grooves extending in the longitudinal direction. The grooves which cut through the active region present a semiconductor-air interface for reflection and/or scattering of laterally propagating light out of the active region. Proton bombarded regions may be provided above the step regions in the top layers to channel current and prevent optical burnout of the step regions. A small percentage of laser light may be allowed to laterally propagate into adjacent active regions to promote phase locking across the laser bar.

29 Claims, 4 Drawing Sheets

LATERAL SUPERRADIANCE SUPPRESSING DIODE LASER BAR

STATEMENT AS TO RIGHTS TO INVENTIONS MADE UNDER FEDERALLY-SPONSORED RESEARCH AND DEVELOPMENT

This invention was made with Government support under contract N66001-5-C-0162 awarded by the Department of the Navy. The Government has certain rights in this invention.

CROSS-REFERENCE TO RELATED APPLICATIONS

This is a continuation-in-part of application Ser. No. 731,652, filed May 7, 1985, now abandoned.

TECHNICAL FIELD

The invention relates to semiconductor diode lasers and in particular to diode laser bars suppressing lateral superradiance.

BACKGROUND ART

Advances in prior art diode lasers have generally concentrated on improving the performance of individual laser emitters. Gain guided lasers, and lasers incorporating lateral real refractive index waveguiding are discussed in W. Streifer, R. D. Burnham, D. R. Scifres, "Current Status of (GaAl)As Diode Lasers," SPIE Vol. 269 Integrated Optics, pages 1-7, February, 1981. These lasers have lower threshold currents, increased efficiency and better beam characteristics than the first diode lasers.

The buried-heterostructure diode injection laser, disclosed in U.S. Pat. No. 4,033,796 to Burnham et al., is formed by etching a groove or channel into a substrate. An active layer has a bowl-shaped central portion that is completely surrounded by light guiding, current confining layers. Light waves produced by this laser are guided in the central portion of the active layer, making lowest order transverse modes possible in CW room temperature operation.

It is desirable to fabricate diode laser bars with a linear array of laser beam emitting segments along the width of a bar face. Such a laser bar may be butted against Nd:YAG media to provide optical pumping of Nd:YAG lasers. A laser bar could be constructed by combining individual laser emitters. However, the lateral packing density, i.e. the percentage ratio of the width of the light emitting regions to the total width of the diod laser bar would be small. For example, a channeled substrate laser emits a five micron wide beam from a 250-micron-wide crystal face, making the packing density only two percent.

Greater power output capability is required for diode laser bars to be useful in such high power applications as Nd:YAG laser pumping and the like. Factors which improve the output power include phase locking of the array, increasing the total number of light-emitting regions, and widening the emitting width as with a wide stripe laser. However, based on past designs the width of the emitting regions had to be limited in order to suppress lateral superradiance. Such suppression was achieved via light absorption outside the pumped stripe width. Lateral superradiance, which is amplified spontaneous emission in the lateral direction, consumes power which might otherwise go into useful light amplification in the longitudinal direction. Unfortunately, as the packing density increases, and as the width of a laser bar increases in order to increase the width of or total number of light-emitting regions, superradiance increases to a point where it is a serious power drain.

Wide oxide stripe laser bars have been fabricated which emit a multitude of gain-guided beams from their emitting face. A plurality of periodically spaced parallel stripes of oxide material, proton bombarded regions, or other insulating stripes are deposited on the top layer of the laser diode and covered with a metallization layer. Those regions of the active layer beneath metal contact areas are pumped, while those regions beneath the insulating stripes are absorbing. Typically, the pumped regions might be 60 microns wide, while the laser chip is 250 $\mu$m wide. Thus, the packing density for this chip is about 25%. There is sufficient absorption on either side of the gain region to suppress superradiance. Furthermore, the typical cavity length is 250 $\mu$m so that the gain in the longitudinal direction far exceeds the gain in the transverse (60 $\mu$m) direction which suppresses superradiance.

In an article entitled "High-Power Individually Addressable Monolithic Array of Constricted Double Heterojunction Large-Optical-Cavity Lasers" by D. Boetz et al. in Applied Physics Letters, December, 1982, pp. 1040-1042, a linear array of ten emitters is disclosed. The array features a convex lens-shaped active layer and a concave lens-shaped guide layer with oxide stripes for current confinement. The linear packing density is less than 10%.

A packing density close to 100 percent, i.e. laser emission across nearly the entire width of the bar, is preferred. The oxide insulation could be eliminated and the entire active region could then be pumped. However, as the emitting segment along a bar becomes wider than about 500 microns, for a 250 microns long laser (distance between cleaved mirrors is 250 microns) lateral superradiance, i.e. stimulated emission in the direction parallel to the cleaved end mirrors, and the p-n junction, i.e., perpendicular to the line between the mirrors, may occur. Oxide stripe lasers having a packing density less than 50 percent avoid this problem because of their large absorbing regions, but as the packing density increases, the amount of coupling between emitting segments increases, and light becomes amplified in each gain section by more than it is attenuated in each absorbing section. So wide oxide stripe lasers with a packing density greater than 50 percent have undesirable lateral superradiance.

Phased locking or wide pumped region constructions have greatly in-creased the power output capability of diode lasers. Insulating stripe laser bars have been phase-locked for packing densities of up to 40 percent. For example, a 1 mm wide laser bar constructed with 40 insulating stripes on 10 m spacings had a phase-locked emitting region 400 microns wide. However, when the phase-locked emitting region was extended to 600 microns wide, lateral superradiance resulted.

In. U.S. Pat. No. 4,594,718, Scifres et al. disclose a semiconductor laser array which comprises a substrate, a cladding layer, active layer(s), cladding layer and contact layer. An optical cavity is provided in the longitudinal direction of the active region between end facets and a plurality of laser beams are emitted from a plurality of waveguides. The laser has current confinement regions for pumping the active region along each waveguide. The laser array substrate has a cross-shaped channel or mesa configuration provided with a contiguous central gain-guiding region that extends transversely through the laser array with a plurality of narrow index guiding regions or waveguides extending from the central region to either end facet. Each waveguide supports the propagation of only a single transverse mode. The configuration allows coupling of light in the gain-guided sections for phase-locked operation.

In the laser array, only the channel portions form waveguides that allow light to propagate under lasing conditions, because the cross-shaped configuration introduces steps between the mesa portions of the index guided regions and the gain-guided region, which steps cause any longitudinally propagating light in the mesa portions to be scattered or deflected out of the active region. Similarly, an alternate embodiment introduces steps between channel portions of the index-guided regions and the gain-guided region so that only mesa portions allow light propagation under lasing conditions. Further, the gain-guided region functions very much like the oxide stripe laser bars mentioned above. When the pumped portion of the gain-guiding region is less than 50 percent of the total gain-guiding region, lateral superradiance is avoided because of the large absorbing regions between the pumped portions. Were the pumped portions to be increased above 50 percent, undesirable lateral superradiance in the gain-guiding region would result. Accordingly, only those portions of the gain-guiding region corresponding to channel portions (alternatively mesa portions) are pumped. (The channel portions themselves avoid superradiance since they only support a single transverse mode, and are strongly indexguiding so as to prevent optical coupling between waveguides.) For these reasons, the laser array of the '718 patent has a maximum packing density of about 45–50 percent.

An object of the invention is to provide a diode laser bar having a packing density up to near 100 percent that does not have lateral superradiance, especially for laser bars with multimode waveguides.

DISCLOSURE OF THE INVENTION

The above object has been met with a diode laser bar having an active region that suppresses lateral superradiance. The active region has spaced-apart interruptions that take laterally propagating light out of the active region while leaving longitudinally propagating light unaffected. In one embodiment, the active region is corrugated with offset grooves and plateaus alternating in a lateral direction and extending in a longitudinal direction. Laterally propagating light is (1) deflected and scattered and/or (2) propagates out of the active region between grooves and plateaus, while light propagating in a longitudinal direction along the grooves and plateaus is unaffected.

The diode laser has a plurality of semiconductor material layers disposed one atop another on a semiconductor material substrate. At least one of the layers forms the active region. The layers are doped so as to provide a rectifying p-n junction adjacent to the active region. For example, in a double heterostructure laser, a substrate and a first layer are of one conductivity type, while a second layer and top layers are of the opposite conductivity type. The active region is sandwiched between first and second layers and may be of either conductivity type. First and second layers have a greater bandgap than the active region for confining injected current, and also have a lower index of refraction than the active region for transverse wave guidance.

A photoresist mask is used to lithographically pattern the substrate. Channels are then etched into the upper surface of the substrate. Additional layers are grown upon the substrate using MO-CVD (metal-organic chemical vapor deposition) or other crystal growth techniques. Each layer generally has a constant thickness, thus creating the corrugation in the active layer. The grooves in this corrugation lie directly above the substrate channels, while the plateaus lie above the unetched portions of the substrate.

Light propagates under lasing conditions in both the plateau and groove portions of the active region, thereby achieving a high lateral packing density. Only portions of the active region around the steps remain unpumped. Further, some optical coupling, i.e. about 1 percent, may occur through the interrupting means, i.e. across the steps. This coupling allows the laser array to achieve phase-locking of all the emitting regions.

In an alternate embodiment, crystal layers are first grown on a planar substrate. Then a plurality of parallel v-shaped grooves are etched into the laser diode through the active region. An insulating region is formed adjacent to the v-shaped grooves to suppress current flow through the v-groove region. Laterally propagating light is deflected, scattered or otherwise interrupted where the groove cuts into the active region, while light propagating in the longitudinal direction travels parallel to the grooves and is unaffected. This embodiment achieves a lateral packing density of at least 40 percent.

The advantage of either corrugations or v-shaped grooves is that these lateral interruptions in the active region can be made very narrow, while the rest of the active layer is used for emitting laser light. Further, the structure can be repeated to create laser bars on the order of one centimeter wide without lateral superradiance, and in which the packing density is at least 50 percent and preferably greater than 90 percent. Also, when the corrugation is made very shallow, phase locking can be achieved for high packing densities without lateral superradiance.

BEST MODE FOR CARRYING OUT THE INVENTION

Figure 1:
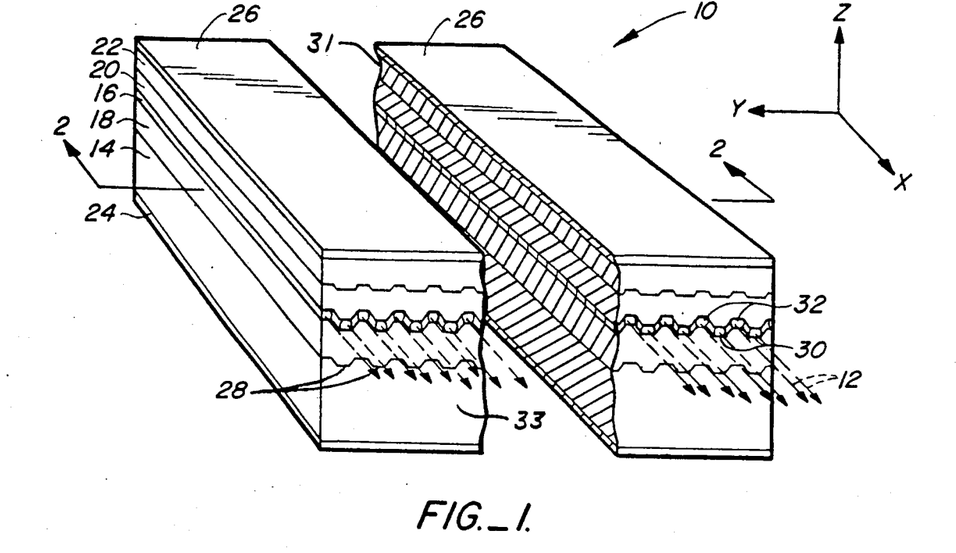
FIG. 1 is a perspective view of a preferred embodiment of the laser bar of the present invention.

With reference to FIG. 1, a diode laser bar 10 emits multiple laser beams 12 in a longitudinal direction X. Laser bar 10 has a semiconductor material substrate 14, upon which a plurality of semiconductor material layers are deposited. Substrate 14 may be any semiconductor material suitable for use in a diode laser, such as GaAs or InP. Substrate 14 is typically 70-100 microns thick.

An active region 16 is sandwiched between a first layer 18 and a second layer 20. First layer 18 is disposed on top of substrate 14. A top layer 22 is disposed on second layer 20. Alternatively, additional layers may be deposited between first layer 18 and substrate 14, and between second layer 20 and top layer 22.

First and second layers 18 and 20 are usually confining layers having higher band gaps and lower indices of refraction than active region 16. The higher band gaps of first and second layers 18 and 20 confine injected carriers of the diode laser to the active region 16. The lower indices of refraction cause first and second layers 18 and 20 to act as waveguides, confining the propagating light waves to the active region 16. The higher band gaps and lower indices of refraction are created by adding Al to confining layers 18 and 20. Typically, the composition of these layers 18 and 20 is approximately $Ga_{0.6}Al_{0.4}As$.

Active region 16 is composed of one or more layers. In ordinary diode lasers, the active region 16 is generally a single layer having a composition $Ga_{1-x}Al_xAs$ where x is between 0.0 and 0.1. Laser bar 10 may also be a quantum well laser, in which case the active region 16 is made up of more than one layer. Quantum well lasers are described in Nick Holonyak, Jr. et al., "Quantum-Well Heterostructure Lasers", IEEE Journal of Quantum Electronics, Vol. QE-16, No. 2, 170-186, February, 1980.

The layers are doped to provide a rectifying p-n junction adjacent to the active region 16. Se and Zn may be used as the n-type and p-type dopants respectively. Other dopants may also be used. Substrate 14 and first layer 18 are usually n-type conductivity, while second layer 20 and top layer 22 are usually p-type conductivity. Alternatively, the conductivity types may be reversed, as long as substrate 14 and first layer 18 are of one conductivity type and layer 20 and 22 are of the opposite conductivity type. Active region 16 may be either n- or p-conductivity type.

Figure 2:
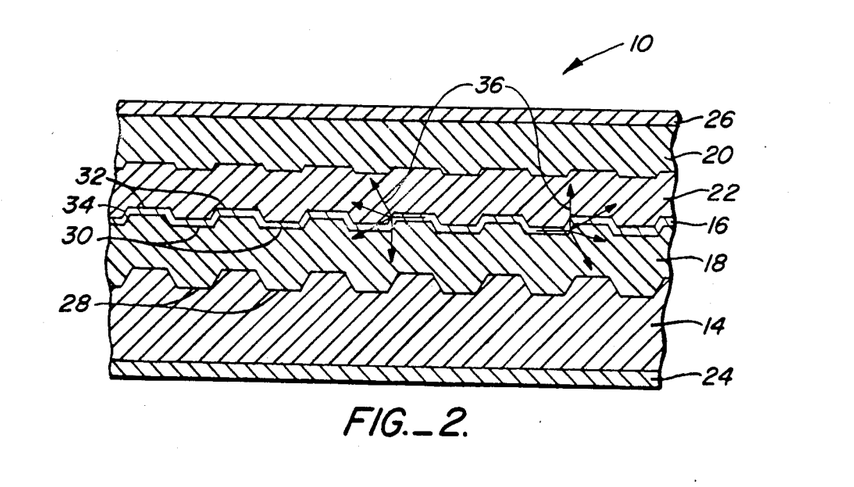
FIG. 2 is a partial side sectional view taken along the line 2—2 in FIG. 1.
Figure 3A:
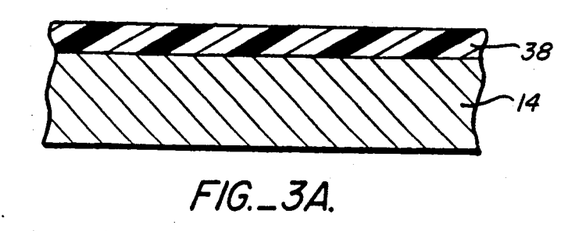
FIGS. 3a–3d are side sectional views showing a plan for making the laser bar of FIG. 1.
Figure 3B:
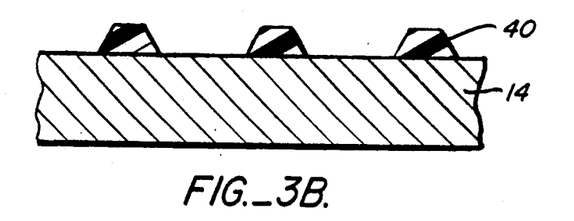
Figure 3C:
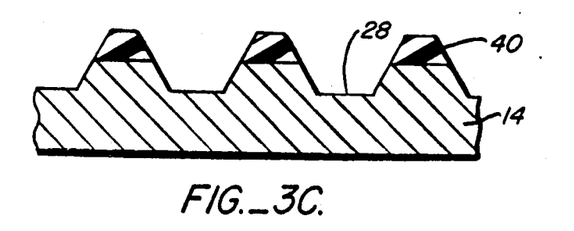
Figure 3D:
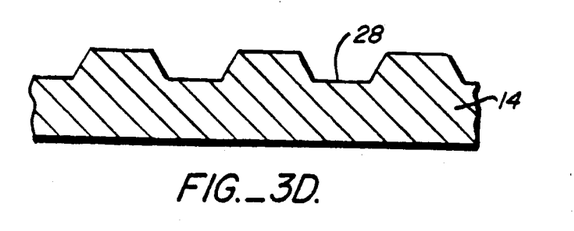

In FIGS. 1 and 2, the layers 16, 18, 20, and 22 disposed on substrate 14 can be seen to be corrugated. Substrate 14 has a plurality of parallel spaced channels 28. The channels extend in longitudinal direction X along the entire length of the laser. The layers disposed on substrate 14 have substantially uniform thickness, so that the resulting structure is one of alternating offset grooves and ridges. This corrugation is most important for active region 16. Grooves 30 alternate with plateaus 32 in active region 16 with the grooves 30 disposed directly above channels 28 in substrate 14. Grooves 30 and plateaus 32 extend in longitudinal direction X along the entire length of the laser. Steps 34 mark the boundary between offset grooves 30 and plateaus 32.

Typically, the steps 34 are laterally spaced apart at between 0.3 and 1.5 times the length of a laser cavity. Laser bar 10 has a length of from 150 to 750 microns. 250 micron and 500 micron long laser cavities are typical. The spacing between steps 34 is at least 30 microns, and typically between 40 and 250 microns. Accordingly, the widths of the grooves 30 and plateaus 32 are typically between 40 and 250 microns. Grooves 30 and plateaus 32 therefore can support multiple transverse modes. Single mode waveguides, e.g. in oxide stripe lasers with stripe widths less than 10 microns, do not normally have a problem with lateral superradiance. However, multimode waveguides, such as those found in oxide stripe lasers with stripe widths 10 microns or greater or in broad area lasers with widths up to 1 mm or higher, may undergo lateral superradiance if the laser bar is wider than about 1.5 times the cavity length. Superradiance is a severe power drain for lasers twice as wide or wider as they are long. Steps 34 spaced at between 0.3 and 1.5 times the length of the laser cavity interrupt laterally propagating light so that wider laser bars can be constructed without the problem of lateral superradiance.

Light 36 propagating in a lateral direction Y is interrupted, being deflected and scattered or transmitted at steps 34 out of the active layer. Light 12 propagating in a longitudinal direction X in the active region 16 encounters no steps 34 so is not interrupted and does not propagate out of the active layer. Light 12 experiences gain in the optical cavity between cleaved mirrors facet 31 and 33 and is eventually emitted as laser light. Laser bar 10 has a maximum pulsed peak power output of about 25 W/cm. Laser bar 10 has metal contacts 24 and 26, for supplying current to active region 16. These contacts cover the entire bottom of substrate 14 and top of top layer 22, so both grooves 30 and ridges 32 of active layer 16 are pumped. Light 12 emerges from mirror facet 31 from both groove 30 and plateau 32. Only in the stepped region 34 may light not propagate. Thus a lateral packing density, i.e. a ratio of the width of the light emitting regions 30 and 32 to the total width of the laser bar 10, is at least 50 percent, preferably over 90 percent and may approach 99 percent.

In FIGS. 3a-3d laser bar 10 is made by first coating a planar substrate 14 with a photoresist material 38. Photoresist 38 is then exposed to light through a mask and the unexposed portion is washed away. Parallel and spaced apart stripes of photoresist 40 result. Channels 28 are chemically etched in the substrate 14. Channels 28 are typically 1000 nm deep, but may be made shallower. If phase locking is desired grooves of approximately 100 nm or less depth may be used. The laser bar that results from shallow etching has a transverse misalignment of adjacent active region forming layers at spaced apart intervals, the misalignment permitting some optical coupling of optical energy, typically about one percent, for phase locked laser operation. After substrate 14 is etched, photoresist 40 is removed. Subsequent layers are grown on the substrate to form the laser of FIGS. 1 and 2. MO-CVD (metal-organic chemical vapor deposition) or MBE (molecule beam epitaxy) may be used to grow the layers. MO-CVD, described in R. D. Dupuis, "Metalorganic Chemical Vapor Deposition of III-V Semiconductors", Science, vol. 226, pp. 623-629, Nov. 9, 1984, is the preferred method, particularly for quantum well laser bars because smooth, very thin layers can be formed with this method. Liquid Phase Epitaxy, (LPE) may also be used.

Figure 4:
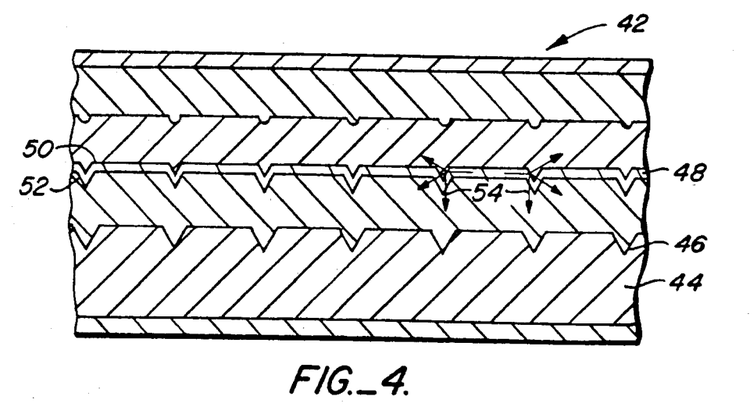
FIG. 4 is a partial side sectional view of a second embodiment of the present invention.

In FIG. 4, a laser bar 42 is constructed in a manner similar to the laser bar 10 in FIGS. 1 and 2. Laser bar 42 has a substrate 44 with etched grooves 46. Grooves 46 are similar to channels 28 in FIG. 2, except that grooves 46 are narrower than channels 28. An active region 48 results having alternating plateaus 50 and grooves 52. Grooves 52 are unlike grooves 30 in FIG. 2 in that grooves 52 are no narrow that they are really only back to back steps that interrupt the otherwise planar active region. Even so, grooves 52 act to deflect and scatter transversely propagating light 54 out of the active region. Plateaus 50 may be any width up to about 500 microns. Light propagating longitudinally along plateaus 50 is emitted as laser beams, so for a groove width of about 5 microns, the packing density may be 99 percent.

Figure 5:
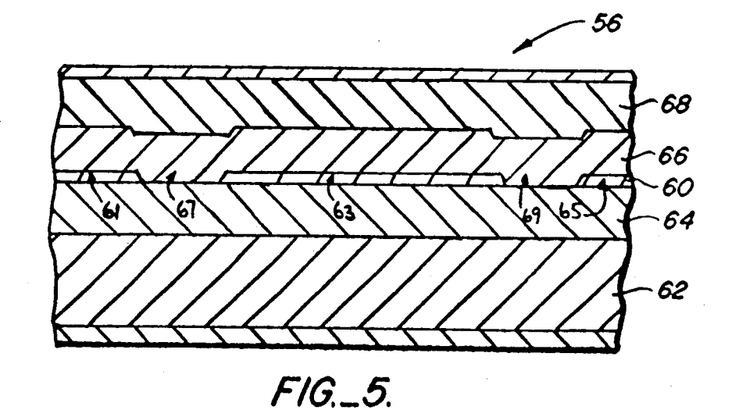
FIG. 5 is a partial side sectional view of a third embodiment of the present invention

In FIG. 5, laser bar 56 includes a plurality of planar layers 64, 60, 66, 68 deposited on a planar substrate 62. Layers 64, 60, 66 and 68 are identical in all respects to the layers of FIGS. 1 and 2 with the exception that they are planar. The active region 60 comprises a plurality of light emitting portions 61, 63 and 65 extending along the longitudinal direction from facet to facet and separated from one another by absorbing regions 67 and 69 at spaced apart intervals. Absorbing regions 67 and 69 are regions where the active region 60 has been etched away or otherwise removed so that the layers forming the active region 60 are absent. Absorbing regions 67 and 69 absorb laterally propagating light thereby interrupting the active region and suppressing lateral superradiance.

Figure 6:
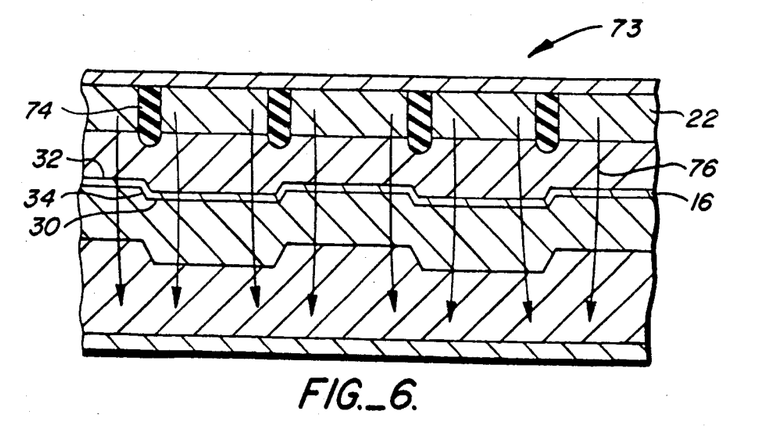
FIG. 6 is a partial side sectional view of a fourth embodiment of the present invention.

Laser bar 73 in FIG. 6 is like laser bar 10 in FIG. 2, except that top layer 22 has proton implanted regions 74 in laser bar 73. Active region 16 has laterally alternating grooves 30 and plateaus 32. In some cases, steps 34, which link adjacent grooves and ridges, may have a lower threshold than planar regions 30 and 32. In order to prevent premature optical burnout of these step regions 34, current 76 must be confined to channels above the planar regions 30 and 32. Proton implanted regions 74 positioned directly above steps 34 act as insulators to channel the current 76 and prevent pumping of the step regions 34. Alternatively, other current channeling means may be used in place of proton implanted regions 74. Strips of insulating material may be photolithographically deposited on top layer 22 above steps 34, or an additional layer of semiconductor material may be deposited above top layer 22 and doped to provide a reverse biased junction above steps 34.

Figure 7A:
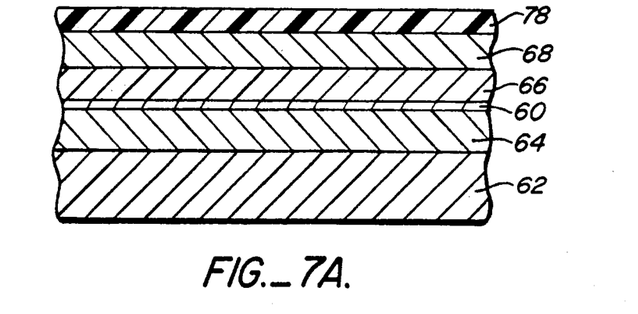
FIGS. 7a–7c are side sectional views illustrating steps for making the laser bar of FIG. 8.
Figure 7B:
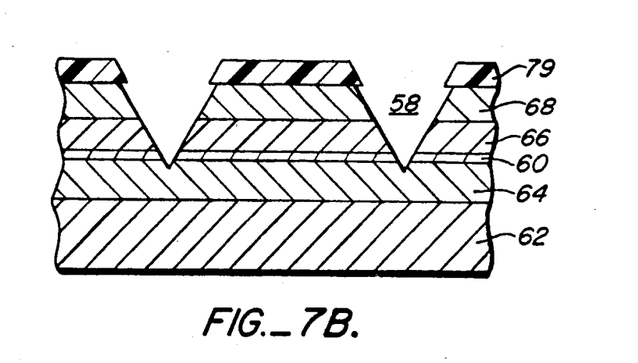
Figure 7C:
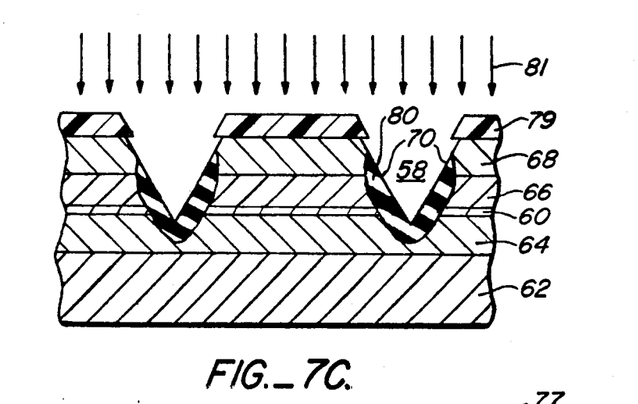

In FIGS. 7a–7c, a laser bar is made by first growing a plurality of layers 64, 60, 66 and 68 on a planar substrate 62. The layers are identical in all respects to the layers of FIG. 5 except that v-shaped grooves replace the removed active region portions. MO-CVD, MBE, or LPE may be used to grow the layers. Top layer 68 is coated with a photoresist material 78 to a thickness of 3 m, which is then exposed to light through a mask and the unexposed portion is washed away. Parallel and spaced apart stripes of photoresist 79 result. A plurality of parallel laterally spaced V-shaped grooves 58 are etched through layers 68 and 66, then through active region 60 into layer 64. Grooves 58 form sloping facets 70 which deflect and scatter laterally propagating light out of active region 60.

Figure 8:
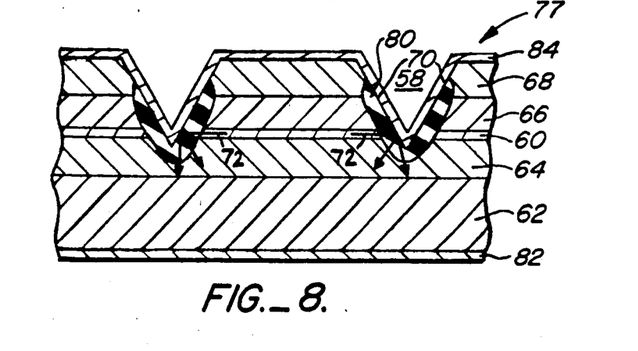
FIG. 8 is a partial side sectional view of a fifth embodiment of the present invention.

Removing the photoresist 79 and applying metallization layers to substrate 62 and top layer 68 at this point would give laser bar 56 in FIG. 5. Instead, photoresist 79 is kept and the top surface 70 and 79 is bombarded with protons to create insulating proton implanted regions 80. Insulating regions 80 extend into layers 68, 66, 60 and 64 from groove facets 70. Finally, photoresist 79 is removed and metallization layers 82 and 84 are applied to substrate 62 and top surface 70 and 78 to obtain laser bar 77 in FIG. 8. The resulting laser bar 77 has a plurality of parallel laterally spaced v-shaped grooves 58 etched through layers 68 and 66, then through active region 60 into layer 64. Grooves 58 form sloping facets 70 which cut through and interrupt the planar active region to deflect and scatter laterally propagating light 72 out of active region 60. Deflection by facets 70 is accomplished primarily by reflection, because the index of refraction of active region 60 is about 3.6 and that of air in groove 58 is 1.0. Laser bar 77 also includes an insulating region 80 around groove 58. Insulating region 80 serves to prevent metallization in the grooves 58 from shorting out across the active region 60, and suppresses damaging current flow across the active region 60 near the V-groove facets 70. Laser bar 77 achieves a lateral packing density of at least 40 percent and preferably over 80 percent without lateral superradiance.

In the embodiments described herein, the active region interrupting means may be made less than totally interrupting, allowing a small percentage of the laterally superradiant light from one active region to enter an adjacent active region. This small percentage, say about one percent, causes phase locking of the stimulated emission, resulting in higher output power.

In discussing V-grooves, that term will be understood to encompass grooves which are not perfect v-grooves, but may have curved walls or appear to be u-grooves or the like.

We claim:
1. A diode laser bar comprising,
   a plurality of semiconductor layers disposed one atop another on a semiconductor substrate, with the layers having a length defining a longitudinal direction, a width defining an edge-to-edge lateral direction and a depth defining a transverse direction, said directions being mutually perpendicular, at least one of said layers forming an active lasing region, said layers being doped to provide a p-n junction adjacent to said active region,
   electrode means for supplying current to said active region,
   feedback means for providing an optical cavity in the longitudinal direction of said active region, and
   active region interrupting means at space apart intervals in said active region for suppressing amplified spontaneous emission in the lateral direction, wherein the lasing region is at least 50 percent of the total active region interrupting means plus said lasing region.

2. The diode laser bar of claim 1 wherein said active region interrupting means comprises corrugations in said active region, said corrugations being a plurality of offset plateaus and grooves alternating in said lateral direction and extending along said longitudinal direction.

3. The diode laser bar of claim 1 wherein said active region comprises a plurality of light-emitting portions extending along said longitudinal direction, said portions being separated from one another by said active region interrupting means, said active region interrupting means comprising absorbing regions wherein said layers forming said active region are absent.

4. The diode laser bar of claim 1 wherein said active region interrupting means comprises a transverse misalignment of adjacent active region forming layers at spaced apart intervals, said active region interrupting means permitting coupling optical energy thereacross for phase locked laser operation.

5. A diode laser bar comprising,
   a plurality of semiconductor layers disposed one atop another on a semiconductor substrate, with the layers having a length defining a longitudinal direction, a width defining an edge-to-edge lateral direction and a depth defining a transverse direction, said directions being mutually perpendicular, at least one of said layers forming an active lasing region, said layers being doped to provide a p-n junction adjacent to said active region, electrode means for supplying current to said active region, feedback means for providing an optical cavity in the longitudinal direction of said active region and producing a plurality of laser beams, and active region interrupting means at spaced apart intervals in said active region for suppressing amplified spontaneous emission in the lateral direction, said active region interrupting means having an aggregate lateral extent which is limited compared to the lateral lasing region between said edges, said active region interrupting means comprising corrugations in said active region, said corrugations being a plurality of offset plateaus and grooves alternating in said lateral direction and extending along said longitudinal direction, both of said plurality of plateaus and said plurality of grooves forming said active lasing region where lightwaves propagate in said longitudinal direction under lasing conditions, wherein the lasing region is at least 50 percent of the total active region interrupting means plus said lasing region.

6. The diode laser bar of claim 5 wherein the lasing region is at least 90 percent of the total active region.

7. The diode laser bar of claim 5 wherein said active region interrupting means is periodic in the lateral direction.

8. The diode laser bar of claim 5 wherein some of said amplified spontaneous emission in the lateral direction is coupled through said interrupting means between adjacent active regions thereby promoting phase locking across said laser bar.

9. The diode laser bar of claim 5 wherein the semiconductor layers immediately adjacent to and on both sides of said active region have a greater band gap and lower refractive index than said active region.

10. The diode laser bar of claim 5 wherein the width of said plateaus is equal to the width of said grooves.

11. The diode laser of claim 5 wherein the width of said grooves is substantially less than the width of said plateaus.

12. A hetero-structure diode laser bar comprising, a semiconductor material substrate of one conductivity type having a major surface, with a length defining a longitudinal direction, a width defining a lateral direction and a depth defining a transverse direction, said directions being mutually perpendicular, with a laterally periodic plurality of channels extending in a longitudinal direction, first and second semiconductor layers which sandwich an active lasing region therebetween, having a greater bandgap and lower refractive index than said active region, said active region being composed of at least one semiconductor material layer, said first layer disposed on said substrate and being of the same conductivity type as said substrate, said second layer being of the opposite conductivity type from said first layer, said first and second layers and said active region having lateral corrugations for suppressing amplified spontaneous emission in the lateral direction, with groove regions extending in said longitudinal direction above said channels in said substrate and plateau regions extending in said longitudinal direction between said groove regions, both said plateau regions and said groove regions forming said active lasing region where lightwaves propagate in said longitudinal direction under lasing conditions, the active lasing region emitting radiation over at least 50 percent of the total width of the laser bar, a top semiconductor layer of said same conductivity type as said second layer, said top layer disposed above said second layer, electrode means for supplying current to said active region, and feedback means for providing an optical cavity in the longitudinal direction of said active region and producing a plurality of laser beams.

13. The diode laser bar of claim 12 wherein the active lasing region emits radiation over at least 90 percent of the width of the laser bar.

14. The diode laser bar of claim 11 wherein said lateral corrugations couple some of said spontaneous emission in the lateral direction across steps between adjacent active regions thereby promoting phase locking across said laser bar, said steps being at boundaries between said groove regions and said plateau regions.

15. A diode laser bar comprising, a plurality of semiconductor layers disposed one atop another on a semiconductor substrate, with the layers having a length defining a longitudinal direction, a width defining an edge-to-edge lateral direction and a depth defining a transverse direction, said directions being mutually perpendicular, at least one of said layers forming an active lasing region, said layers being doped to provide a p-n junction adjacent to said active region, electrode means for supplying current to said active region, feedback means for providing an optical cavity in the longitudinal direction of said active region, and active region interrupting means at spaced apart intervals in said active region for suppressing amplified spontaneous emission in the lateral direction, said active region including a plurality of waveguides, each waveguide capable of supporting multiple transverse modes.

16. The diode laser bar of claim 15 wherein said interrupting means is spaced at between 0.3 and 1.5 times the length of the cavity.

17. The diode laser bar of claim 15 wherein said interrupting means is laterally spaced apart by greater than 30 microns.

18. A diode laser bar comprising, a semiconductor substrate, a plurality of semiconductor material layers disposed one atop another on said substrate, at least one of said plurality of layers forming an active region, said plurality of layers being doped to provide a rectifying junction adjacent to said active region, a plurality of parallel laterally space V-shaped grooves etched through said active region for suppressing amplified spontaneous emission perpendicular to said grooves, wherein an insulating region is formed adjacent the V-shaped grooves to suppress current flow through said V-groove region, electrode means for supplying current to said active region, and feedback means for providing an optical cavity in a longitudinal direction of said active region and producing a plurality of laser beams, said plurality of laser beams emitting radiation over at least 40% of said laser bar.

19. A diode laser bar comprising,
a plurality of semiconductor layers disposed one atop another on a semiconductor substrate, with the layers having a length defining a longitudinal direction, a width defining an edge-to-edge lateral direction and a depth defining a transverse direction, said directions being mutually perpendicular, at least one of said layers forming an active lasing region, said layers being doped to provide an active lasing region, said layers being doped to provide a p-n junction adjacent to said active region,
electrode means for supplying current to said active region,
feedback means for providing an optical cavity in the longitudinal direction of said active region and producing a plurality of laser beams, and
a plurality of parallel laterally spaced V-shaped grooves etched through said active region at spaced apart intervals in said active region for suppressing amplified spontaneous emission in the lateral direction, an insulating region being formed adjacent the V-shaped grooves to suppress current flow through said V-groove region, said grooves having an aggregate lateral extent which is limited compared to the lateral lasing region between said edges, wherein the lasing region is greater than 40 percent of the total of said grooves plus said lasing region.

20. A diode laser bar comprising,
a plurality of semiconductor layers disposed one atop another on a semiconductor substrate, with the layers having a length defining a longitudinal direction, a width defining an edge-to-edge lateral direction and a depth defining a transverse direction, said directions being mutually perpendicular, at least one of said layers forming an active lasing region, said layers being doped to provide a p-n junction adjacent to said active region,
electrode means for supplying current to said active region,
feedback means for providing an optical cavity in the longitudinal direction of said active region and producing a plurality of laser beams, and
corrugations at spaced apart intervals in said active region for suppressing amplified spontaneous emission in the lateral direction, said corrugations being a plurality of offset plateaus and grooves alternating in said lateral direction and extending along said longitudinal direction, wherein strips of insulating material are disposed above steps in said active layer, said steps being at boundaries between said grooves and said plateaus, said steps having an aggregate lateral extent which is limited compared to the lateral lasing region between said edges, wherein the lasing region is greater than 40 percent of the total of said steps plus said lasing region.

21. A hetero-structure diode laser bar comprising,
a semiconductor material substrate of one conductivity type having a major surface, with a length defining a longitudinal direction, a width defining a lateral direction and a depth defining a transverse direction, said directions being mutually perpendicular, with a laterally periodic plurality of channels extending in a longitudinal direction,
first and second semiconductor layers which sandwich an active lasing region therebetween, having a greater band gap and lower refractive index than said active region, said active region being composed of at least one semiconductor material layer, said first layer disposed on said substrate and being of the same conductivity type as said substrate, said second layer being of the opposite conductivity type from said first layer, said first and second layers and said active region having lateral corrugations for suppressing amplified spontaneous emission in the lateral direction, with groove regions extending in said longitudinal direction above said channels in said substrate and plateau regions extending in said longitudinal direction between said groove regions, the lateral packing density of said active region being greater than 40 a top semiconductor layer of said same conductivity type as said second layer, said top layer disposed above said second layer,
electrode means for supplying current to said active region, wherein said top semiconductor layer has insulating means disposed above steps in said active region for channeling said current to said groove regions and said plateau regions and away from said steps, said steps being at the boundary between said groove regions and said plateau regions, and
feedback means for providing an optical cavity in the longitudinal direction of said active region and producing a plurality of laser beams.

22. The diode laser bar of claim 20 wherein said insulating means comprises a plurality of proton bombarded implants in said top layer above said steps of said active region.

23. A diode laser bar comprising,
a plurality of semiconductor layers disposed one atop another on a semiconductor substrate, with the layers having a length defining a longitudinal direction, a width defining an edge-to-edge lateral direction and a depth defining a transverse direction, said directions being mutually perpendicular, at least one of said layers forming an active lasing region, said layers being doped to provide a p-n junction adjacent to said active region,
electrode means for supplying current to said active region,
feedback means for providing an optical cavity in the longitudinal direction of said active region, and
means at spaced apart intervals for deflecting laterally projecting light out of said active region, said intervals being chosen such that lateral superradiance is negligible.

24. The diode laser bar of claim 23 wherein the lasing region is at least 50 percent of the width of the laser bar.

25. The diode laser bar of claim 23 wherein said active region includes a plurality of waveguides, each waveguide capable of supporting multiple transverse modes.

26. The diode laser bar of claim 23 wherein said means for deflecting laterally propagating light are spaced apart at intervals of between 0.3 and 1.5 times the length of the optical cavity.

27. The diode laser bar of claim 23 wherein said means for deflecting laterally propagating light are spaced apart by greater than 30 microns.

28. The diode laser bar of claim 23 wherein said means for deflecting laterally propagating light comprise steps in said at least one layer forming said active region.

29. The diode laser bar of claim 23 wherein insulating means are defined proximate to said means for deflecting laterally propagating light for suppressing current flow through said deflecting means.

* * * * *

UNITED STATES PATENT AND TRADEMARK OFFICE
CERTIFICATE OF CORRECTION

PATENT NO. : 4,803,691
DATED : February 7, 1989
INVENTOR(S) : Donald R. Scifres et al.

It is certified that error appears in the above-identified patent and that said Letters Patent is hereby corrected as shown below:

Column 1, line 51, "diod" should read -- diode --.

Column 2, line 52, "in-creased" should read -- increased --.

Column 2, line 56, "10m spacings" should read
  -- 10 $\mu$m spacings --.

Column 6, line 64, "are no narrow" should read
  -- are so narrow --.

Column 7, lines 44-45, "3 m" should read -- 3 $\mu$m --.

Claim 1, column 8, line 37, "space apart" should read
  -- spaced apart --.

Claim 18, column 10, line 57, "laterally space V-shaped" should
  read -- laterally spaced V-shaped --.

Signed and Sealed this

Twenty-ninth Day of May, 1990

*Attest:*

HARRY F. MANBECK, JR.

*Attesting Officer*  *Commissioner of Patents and Trademarks*